United States Patent
Watanabe

(10) Patent No.: US 10,965,115 B2
(45) Date of Patent: Mar. 30, 2021

(54) VEHICLE POWER SUPPLY CIRCUIT

(71) Applicant: Yazaki Corporation, Tokyo (JP)

(72) Inventor: Jin Watanabe, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 77 days.

(21) Appl. No.: 16/574,333

(22) Filed: Sep. 18, 2019

(65) Prior Publication Data

US 2020/0119539 A1   Apr. 16, 2020

(30) Foreign Application Priority Data

Oct. 16, 2018   (JP) .............................. JP2018-195187

(51) Int. Cl.
| | | |
|---|---|---|
| *H02H 3/02* | (2006.01) | |
| *H02H 1/00* | (2006.01) | |
| *H02H 3/087* | (2006.01) | |
| *H03K 17/08* | (2006.01) | |

(52) U.S. Cl.
CPC .......... *H02H 3/023* (2013.01); *H02H 1/0007* (2013.01); *H02H 3/087* (2013.01); *H03K 17/08* (2013.01)

(58) Field of Classification Search
CPC .......... B60Q 1/30; B60Q 1/302; B60Q 1/305; B60R 16/03; H02H 1/0007; H02H 3/023; H02H 3/087; H03K 17/08; H01H 47/22
See application file for complete search history.

(56) References Cited

U.S. PATENT DOCUMENTS

| | | | | |
|---|---|---|---|---|
| 8,699,202 B2* | 4/2014 | Ohshima | ................ | H01H 47/10 361/189 |
| 10,442,305 B2* | 10/2019 | Sato | ........................ | B60R 16/03 |
| 10,821,924 B2* | 11/2020 | Watanabe | .............. | H01H 47/22 |
| 2002/0109949 A1* | 8/2002 | Ueno | ....................... | B60R 16/03 361/2 |
| 2009/0316320 A1* | 12/2009 | Maeda | .................... | B60R 16/03 361/92 |
| 2020/0094758 A1* | 3/2020 | Kawakami | ................ | H02J 7/14 |
| 2020/0122658 A1* | 4/2020 | Watanabe | .............. | H01H 47/22 |

FOREIGN PATENT DOCUMENTS

JP   2005-029020 A   2/2005

* cited by examiner

*Primary Examiner* — Jared Fureman
*Assistant Examiner* — Nicolas Bellido
(74) *Attorney, Agent, or Firm* — Sughrue Mion, PLLC

(57) ABSTRACT

A vehicle power supply circuit includes; a resistor disposed between negative electrode side of the switch portion and positive electrode side of back lamps, of which positive electrode side is connected to the negative electrode side of the switch portion, and the negative electrode side is connected to the positive electrode side of the back lamps; and a rectifier which causes the current of the power supply to flow in one direction from the plurality of switch circuits to the back lamps, of which positive electrode side is connected to the negative electrode side of the plurality of switch circuits, and the negative electrode side is connected to the negative electrode side of the resistor and the positive electrode side of the back lamps.

4 Claims, 4 Drawing Sheets

US 10,965,115 B2

VEHICLE POWER SUPPLY CIRCUIT

CROSS REFERENCE TO RELATED APPLICATIONS

This application is based on and claims priority from Japanese patent application No. 2018-195187 filed on Oct. 16, 2018, the entire contents of which are incorporated herein by reference.

BACKGROUND OF THE INVENTION

1. Technical Field

The present invention relates to a vehicle power supply circuit which is mounted on a vehicle such as an automobile and includes a switch circuit connected to a power supply and switched to an open or short circuit.

2. Background Art

A vehicle power supply circuit is mounted on a vehicle such as an automobile in order to supply electric power from a predetermined power supply to, for example, a lamp device which is an electrical load (see, for example, Patent Literature JP-A-2005-029020). For example, when a transmission of the vehicle is switched to a back gear in order to reverse the vehicle, a switch circuit of the vehicle power supply circuit is short-circuited along with the switching, and a back lamp of a lamp device is turned on.

SUMMARY

A current specification of the switch circuit differs with a type of the transmission of the vehicle, and the vehicle power supply circuit is prepared in various manners depending on a type of the switch circuit. That is, in the vehicle power supply circuit, a circuit structure and constituent elements different in various manners are provided depending on differences in the current specification of the switch circuit.

Here, two types of vehicle power supply circuits 20 and 30 including switch circuits 21 and 31 having mutually different specifications are described as related examples thereof with reference to FIG. 3 and FIG. 4, respectively. FIG. 3 is a circuit schematic diagram illustrating the vehicle power supply circuit 20 in a case of a continuously variable transmission (CVT). FIG. 4 is a circuit schematic diagram illustrating the vehicle power supply circuit 30 in a case of a manual transmission (MT).

The vehicle power supply circuits 20 and 30 of the first and second related examples described here are provided in mutually different specifications depending on differences in the type of the transmission. The vehicle power supply circuits 20 and 30 are used to turn on back lamps L1 and L2 when the transmission is switched to the back gear. Specifically, the vehicle power supply circuit 20 according to a first related example is a circuit for turning on the back lamps L1 and L2 in the case of the continuously variable transmission. The vehicle power supply circuit 30 according to a second related example is a circuit for turning on the back lamps L1 and L2 in the case of the manual transmission.

First, the vehicle power supply circuit 20 according to the first related example is described with reference to FIG. 3. As shown in FIG. 3, the vehicle power supply circuit 20 for turning on the back lamps L1 and L2 according to the first related example includes a power supply B provided by grounding, and a switch circuit 21 switched to an open or short circuit, a relay circuit 22 having an excitation coil 23 and a switch unit 24, and back lamps (lamp devices) L1 and L2 supplied with power from a power supply as an electrical load. A fuse circuit F which protects a circuit from an overcurrent is connected to the power supply B. A pair of the back lamps L1 and L2 are provided and connected in parallel to each other and grounded on a negative electrode side.

The switch circuit 21 is disposed, for example, in an engine room in front of the vehicle, and a positive electrode side thereof is connected to the power supply B via the fuse circuit F. An initial state of the switch circuit 21 is set to be open. In the switch circuit 21 of the related example, a rated value of a current flowing from the power supply B to the switch circuit 21 itself is not particularly limited, and is configured to be applicable to a wide range of current values.

The excitation coil 23 of the relay circuit 22 is connected to a negative electrode side of the switch circuit 21 on a positive electrode side and grounded on a negative electrode side. The switch unit 24 of the relay circuit 22 is connected to the power supply B via the fuse circuit F on a positive electrode side, and is connected to the pair of back lamps L1 and L2 connected in parallel on a negative electrode side. In order to share components between car models, the relay circuit 22 and the fuse circuit F are provided in one unit, and one component is formed as a relay drive circuit U.

With such a configuration, when the transmission is switched to the back gear, the switch circuit 21 is switched from an open circuit to a short circuit to be turned on and energized. By the energization, a current flows to the excitation coil 23 of the relay circuit 22 to generate a magnetic field. According to the magnetic field generation, the switch unit 24 of the relay circuit 22 is switched from an open circuit to a short circuit, and a circuit is connected between the power supply B and the back lamps L1 and L2. Accordingly, electricity is supplied from the power supply B to the pair of back lamps L1 and L2, and as a result, the back lamps L1 and L2 are turned on.

Next, the vehicle power supply circuit 30 according to a second related example is described with reference to FIG. 4. The same or equivalent parts as in the first related example are denoted by the same or equivalent reference numerals in the drawings, and description thereof is omitted or simplified.

As shown in FIG. 4, the vehicle power supply circuit 30 according to the second related example includes a power supply B, a switch circuit 31, a relay circuit 22, and a pair of back lamps L1 and L2. The relay circuit 22 of the related example has the same specification as in the first related example, and is incorporated in a circuit as a common component for standardization of components. However, the excitation coil 23 of the relay circuit 22 is not connected to the circuit, and both ends of the excitation coil 23 are set to be open at all times. That is, the relay circuit 22 of the related example does not function as a circuit having the same structure but does not conduct electricity.

In the case of the manual transmission, a rated value of a current flowing from the power supply B to the switch circuit 31 itself is set in the switch circuit 31. Specifically, it is required as a specification that a current of 1 [A] or more flows to the switch circuit 31. This is because in the case of the manual transmission, it is necessary to remove an oxide film generated at a contact (not shown) of the switch circuit 31.

With such a configuration, when the transmission is switched to the back gear, the switch circuit 31 is turned on and energized. By the energization, power is directly supplied from the power supply B to the pair of back lamps L1 and L2. Accordingly, the pair of back lamps L1 and L2 are turned on.

As described above, the current specifications of the switch circuit are also different depending on the type of the transmission of the vehicle. On the other hand, regardless of the difference in the current specifications of the switch circuit, the vehicle power supply circuit is expected to be standardized and to have increased versatility. Even when the specifications of the switch circuit are different, if the vehicle power supply circuit can be standardized, manufacturing cost can be reduced, and work efficiency at the time of mounting on the vehicle can be improved.

The present invention has been made in view of the above circumstances, and an object thereof is to provide a vehicle power supply circuit that can increase versatility by standardizing a circuit even when the specifications of the switch circuits are different.

In order to achieve the above object, the vehicle power supply circuit according to the present invention is characterized by the following (1) to (4).

(1) A vehicle power supply circuit comprising:

a plurality of switch circuits which are connected in parallel to each other and connected to a power supply at one end to be switched to an open or short circuit separately;

a relay circuit including an excitation coil of which one end is connected to the other end of the plurality of switch circuits separately and the other end is grounded, and a switch unit which is connected to the power supply at one end and is switched from an open circuit to a short circuit since a current flows from the power supply to the excitation coil through the plurality of switch circuits;

one or more loads of which one end is grounded, and the other end is supplied with electric power from the power supply;

a resistor disposed between the other end of the switch portion and one end of the one or more loads, of which one end is connected to the other end of the switch portion, and the other end is connected to the other end of the one or more loads; and a rectifier which causes the current of the power supply to flow in one direction from the plurality of switch circuits to the one or more loads, of which one end is connected to the other end of the plurality of switch circuits, and the other end is connected to the other end of the resistor and the other end of the one or more loads.

(2) The vehicle power supply circuit according to above (1), wherein a rated value of a current flowing from the power supply to the switch circuit is set in at least one of the plurality of switch circuits, and a resistance value of the resistor is set based on the rated value.

(3) The vehicle power supply circuit according to above (1), wherein when mounted on a vehicle, only one of the plurality of switch circuits corresponding to a specification of the vehicle is set to be capable of being switched to an open or short circuit, and the rest of the plurality of switch circuits is set to be open at all times.

(4) The vehicle power supply circuit according to above (1), wherein a plurality of the loads are provided and connected in parallel with each other.

The vehicle power supply circuit having the configuration of the above (1) includes the resistor disposed between the other end of the switch unit and the other end of the loads, of which one end is connected to the other end of the switch unit, and the other end is connected to the other end of the loads; and the rectifier which causes the current of the power supply to flow only in one direction from the plurality of switch circuits to the loads, of which one end is connected to the other end of the plurality of switch circuits, and the other end is connected to the other end of the resistor and the other end of the loads. Therefore, the rated value of the current flowing from the power supply to the switch circuit itself is set in at least one of the plurality of switch circuits, and even when specifications are different between the rest switch circuits, a desired current can flow to the switch circuit in which the rated value is set by using the resistor which is a simple circuit element. Accordingly, even when the specifications of the switch circuits are different, the circuit can be standardized with a simple configuration, and versatility can be improved. Therefore, the manufacturing cost of the vehicle power supply circuit can be reduced, and work efficiency at the time of vehicle mounting can be improved. Further, since the current from the power supply which has flowed to the switch circuits returns through the rectifier to the load sides, loss of electric energy can be reduced.

According to the vehicle power supply circuit having the configuration of the above (2), a resistance value of the resistor is preferably set based on the rated value. In this case, since the resistor having various resistance values can be obtained easily and at low cost, standardization of the circuit can be easily realized, and an increase in manufacturing cost can be prevented.

According to the vehicle power supply circuit having the configuration of the above (3), only one of the plurality of switch circuits corresponding to the specification of the vehicle is set to be capable of being switched to an open or short circuit, and the rest of the plurality of switch circuits is preferably set to be open at all times. In this case, since one of the plurality of switch circuits is selected according to the specification of the vehicle, it can be applied to various vehicle types, and versatility of the circuit can be improved.

According to the vehicle power supply circuit having the configuration of the above (4), a plurality of the loads are provided and preferably connected in parallel with each other. In this case, electric power can be simultaneously supplied from the power supply to the plurality of loads through the switch circuits.

Advantageous Effects of Invention

The configuration of the vehicle power supply circuit of the present invention includes the resistor disposed between the other end of the switch unit and the other end of the loads, of which one end is connected to the other end of the switch unit, and the other end is connected to the other end of the loads; and the rectifier which causes the current of the power supply to flow only in one direction from the plurality of switch circuits to the loads, of which one end is connected to the other end of the plurality of switch circuits, and the other end is connected to the other end of the resistor and the other end of the loads. Therefore, the rated value of the current flowing from the power supply to the switch circuit itself is set in at least one of the plurality of switch circuits, and even when specifications are different between the rest switch circuits, a desired current can flow to the switch circuit in which the rated value is set by using the resistor which is a simple circuit element. Accordingly, even when the specifications of the switch circuits are different, the circuit can be standardized with a simple configuration, and versatility can be improved. Therefore, the manufacturing cost of the vehicle power supply circuit can be reduced, and work efficiency at the time of vehicle mounting can be improved.

The present invention has been briefly described as above. Further, details of the present invention will be clarified further by reading a mode for carrying out the invention (hereinafter, referred to as "embodiment".) described below with reference to attached drawings.

DETAILED DESCRIPTION OF EMBODIMENTS

A specific embodiment according to the present invention is described with reference to drawings.

<Concerning Circuit Configuration of Vehicle Power Supply Circuit>

Figure 1:
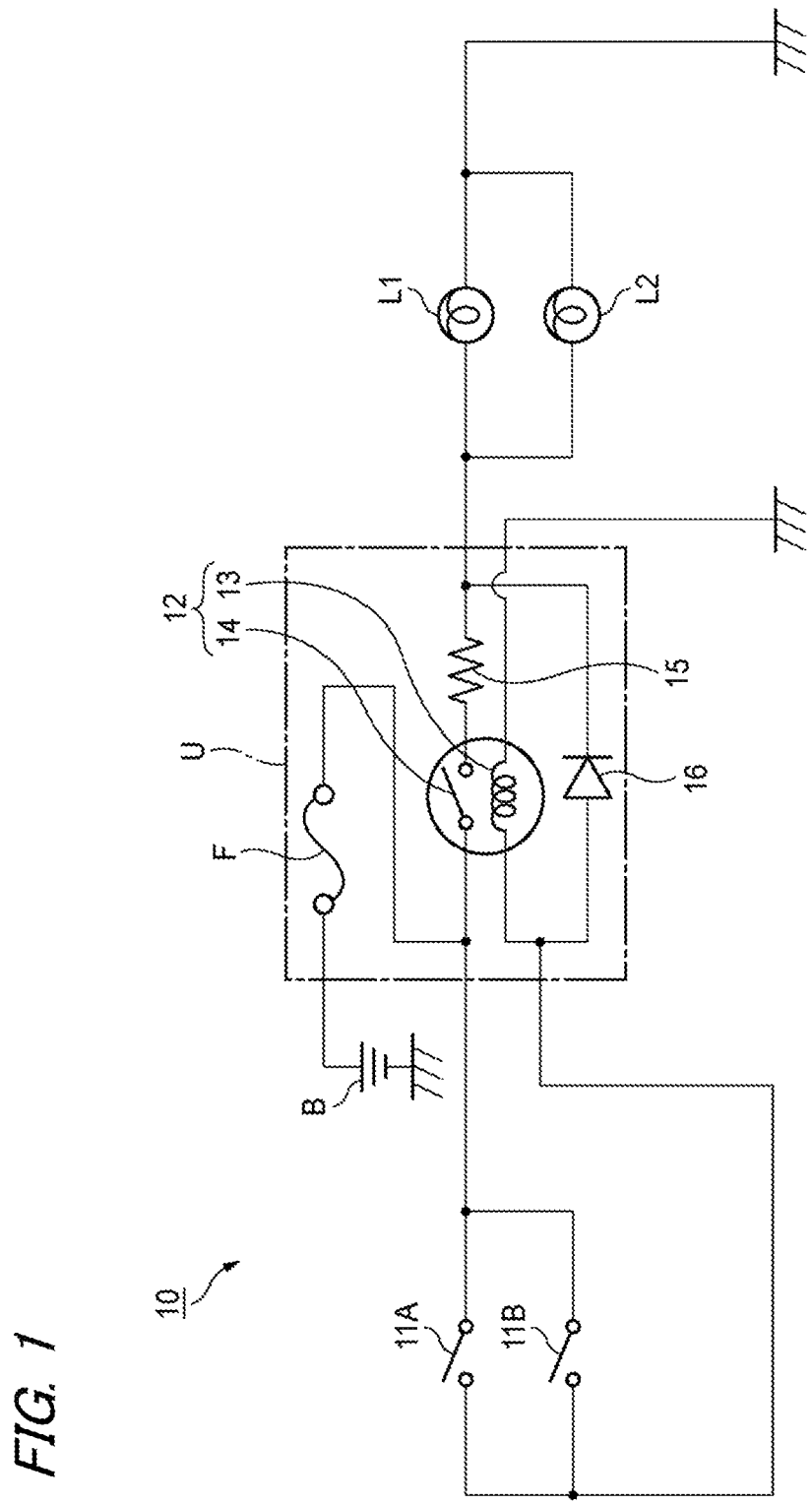
FIG. 1 is a schematic circuit configuration diagram illustrating a vehicle power supply circuit according to an embodiment of the present invention.

A circuit configuration of the vehicle power supply circuit 10 of the present embodiment is described with reference to FIG. 1. FIG. 1 is a schematic circuit configuration diagram illustrating the vehicle power supply circuit 10 according to the present embodiment.

The vehicle power supply circuit 10 of the present embodiment is configured as a power supply circuit adaptable to either case in which a transmission of a vehicle is a continuously variable transmission or a manual transmission. When the transmission is switched to a back gear, the vehicle power supply circuit 10 is mounted on the vehicle in order to turn on the back lamps L1 and L2 as an electrical load to be described later.

As shown in FIG. 1, the vehicle power supply circuit 10 includes a power supply B provided by grounding, a plurality of (two in the present embodiment) switch circuits 11A and 11B, a relay circuit 12 having an excitation coil 13 and a switch unit 14, back lamps (lamp devices) L1 and L2 supplied with power from the power supply B as the electrical load, a resistor 15, and a diode (rectifier) 16.

The vehicle power supply circuit 10 is wired by, for example, extending across the front and back of the vehicle, and constituent elements of the vehicle power supply circuit 10 are connected to each other by an electric wire having a predetermined standard and length.

The power supply B is a power supply such as an alternator or a lead battery, and a negative electrode side (the other end) thereof is grounded, and a positive electrode side (one end) thereof is connected to a fuse circuit F that protects the circuit from an overcurrent. The power supply B supplies power to the vehicle power supply circuit 10 via the fuse circuit F. A pair of the back lamps L1 and L2 are provided and connected in parallel to each other. A negative electrode side of the pair of back lamps L1 and L2 is grounded. The back lamps L1 and L2 are respectively disposed at left and right end portions of a back portion of the vehicle. The back lamps L1 and L2 are turned on when the transmission of the vehicle is switched to the back gear to notify that a host vehicle is in a reversing state with respect to a back of the host vehicle.

In the present embodiment, a voltage value applied to the back lamps L1 and L2 is about 11.7 [V]. Further, although the power supply B is an alternator or a lead battery in the present embodiment, the power supply B is not limited thereto, and various power supplies can be appropriately applied as long as the power supply can supply power. Although examples of the electrical load include the back lamps L1 and L2, the present invention is not limited thereto. Various electrical loads such as a motor can be applied as long as the electrical load requires a voltage of a predetermined value or more. The number of loads is not limited, and a plurality of loads may be connected in series.

The first and second switch circuits 11A and 11B are disposed in, for example, an engine room in front of the vehicle and connected in parallel to each other, positive electrode sides (one end) thereof are connected to the power supply B separately, and the first and second switch circuits 11A and 11B are switched to an open or short circuit separately. The first and second switch circuits 11A and 11B have different specifications from each other. That is, the first switch circuit 11A is a circuit for the manual transmission, and a rated value of a current flowing from the power supply B to the switch circuit 11A itself is set. In the case of the present embodiment, the rated value of the current of the first switch circuit 11A is set to 1 [A]. When the current of 1 [A] or more flows to the first switch circuit 11A, an oxide film generated at a contact (not shown) of the first switch circuit 11A is removed. The second switch circuit 11B is a circuit for the continuously variable transmission. In the second switch circuit 11B, the rated value of the current flowing to the switch circuit 11B itself is not set, and the second switch circuit 11B is adaptable to a wide range of current values. Initial states of the first and second switch circuits 11A and 11B are set to open.

In the present embodiment, as described above, the vehicle power supply circuit 10 includes the first and second switch circuits 11A and 11B. Here, when the vehicle power supply circuit 10 is mounted on a vehicle, only the first switch circuit 11A corresponding to the back gear of the manual transmission (specification of the vehicle) is set to be capable of switching to an open or short circuit when the transmission of the vehicle is a manual transmission. At this time, the second switch circuit 11B is set to be open at all times and is mounted so as not to function as the switch circuit 11B. On the other hand, when the transmission of the vehicle is a continuously variable transmission, only the second switch circuit 11B corresponding to the back gear of the continuously variable transmission is set to be capable of switching to an open or short circuit. At this time, similarly, the first switch circuit 11A is mounted so as not to function as the switch circuit 11A.

Since the switch circuits 11A and 11B are generally low-cost components, even though a part of the plurality of switch circuits 11A and 11B is provided so as not to function as described above, an influence on whole manufacturing cost is small.

A positive electrode side (one end) of the excitation coil 13 of the relay circuit 12 is connected to the first and second switch circuits 11A and 11B separately, and a negative electrode side (the other end) thereof is grounded. A positive electrode side (one end) of the switch unit 14 of the relay circuit 12 is connected to the power supply B via the fuse circuit F. The switch unit 14 of the relay circuit 12 is switched from an open circuit to a short circuit since a current flows from the power supply B to the excitation coil 13 of the relay circuit 12 through the first or second switch circuits 11A and 11B.

In the present embodiment, a current of about 0.12 [A] flows to the excitation coil 13 of the relay circuit 12.

The resistor 15 is disposed between the negative electrode side (the other end) of the switch unit 14 of the relay circuit 12 and the positive electrode side (the other end) of the pair of back lamps L1 and L2. That is, a positive electrode side (one end) of the resistor 15 is connected to the negative electrode side of the switch section 14 of the relay circuit 12, and a negative electrode side of the resistor 15 (the other end) is connected to the positive electrode side of the pair of back lamps L1 and L2. A resistance value of the resistor 15 is set to 5 [Ω] based on the rated value of the first switch circuit 11A.

A positive electrode side (anode, one end) of the diode 16 is connected to the negative electrode side of the first and second switch circuits 11A and 11B, and a negative electrode side (cathode, the other end) is connected to the negative electrode side of the resistor 15 and the positive electrode side of the pair of back lamps L1 and L2. In the diode 16, a current of the power supply B flows only in one direction from the first or second switch circuit 11A or 11B to the pair of back lamps L1 and L2, and does not flow in an opposite direction.

A resistance value of the diode 16 is set to 5 [Ω] to 15 [Ω], and at this time, the resistance value of the resistor 15 is set to 5 [Ω] based on the rated value of the first switch circuit 11A described above. Alternatively, when the resistance value of the diode 16 is 1.7 [Ω] (about three resistant types), the resistance value of the resistor 15 is set to 1 [Ω] based on the rated value of the first switch circuit 11A. The fuse circuit F, the relay circuit 12, the resistor 15, and the diode 16 are provided in one unit, and are integrally assembled as a relay drive circuit U in a vehicle.

<Concerning Electric Path at Time of Energization of Vehicle Power Supply Circuit>

Figure 2:
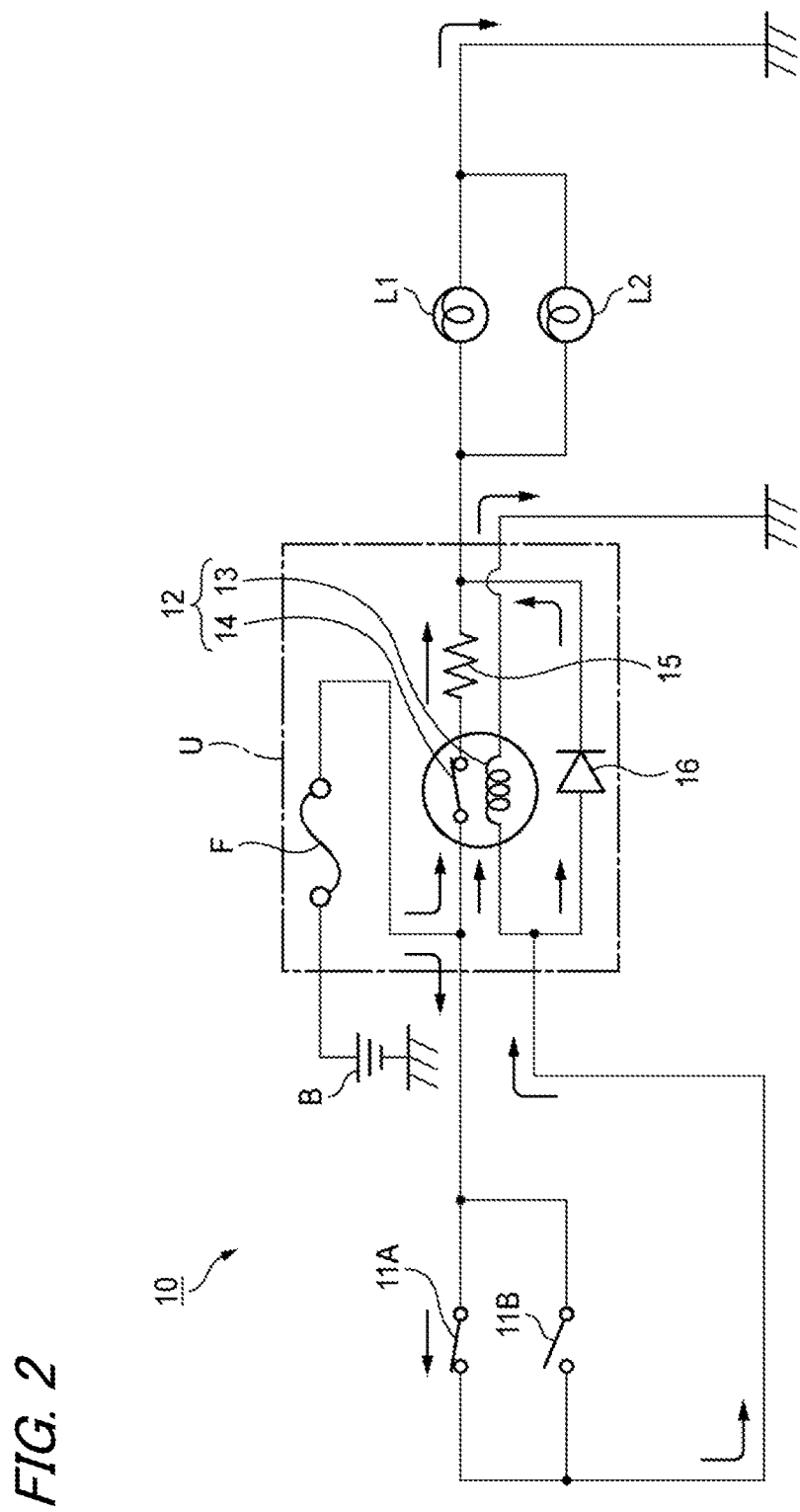
FIG. 2 is a schematic circuit configuration diagram showing a state in which the vehicle power supply circuit shown in FIG. 1 is energized.
Figure 3:
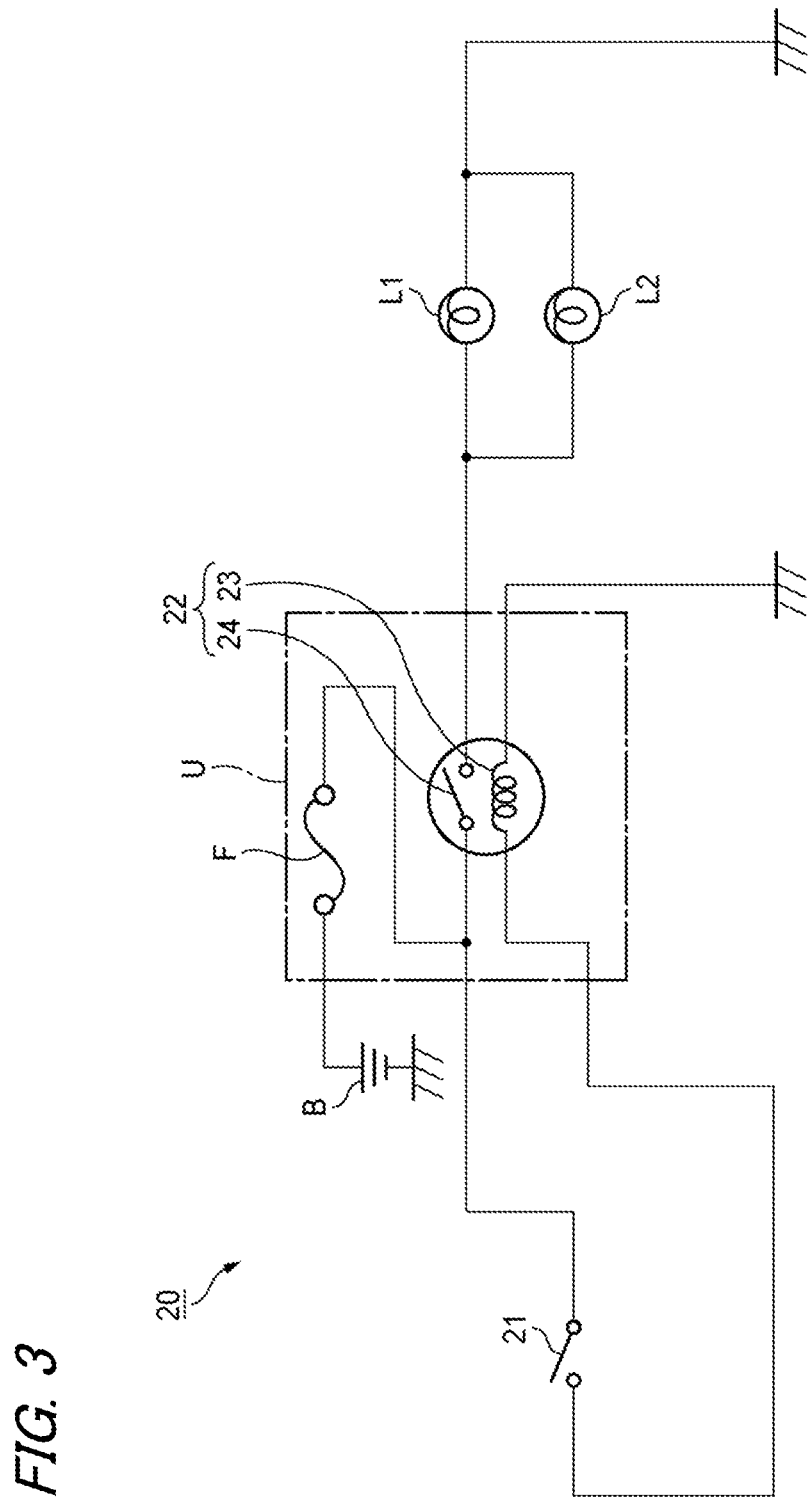
FIG. 3 is a schematic circuit configuration diagram illustrating a vehicle power supply circuit according to a first related example.
Figure 4:
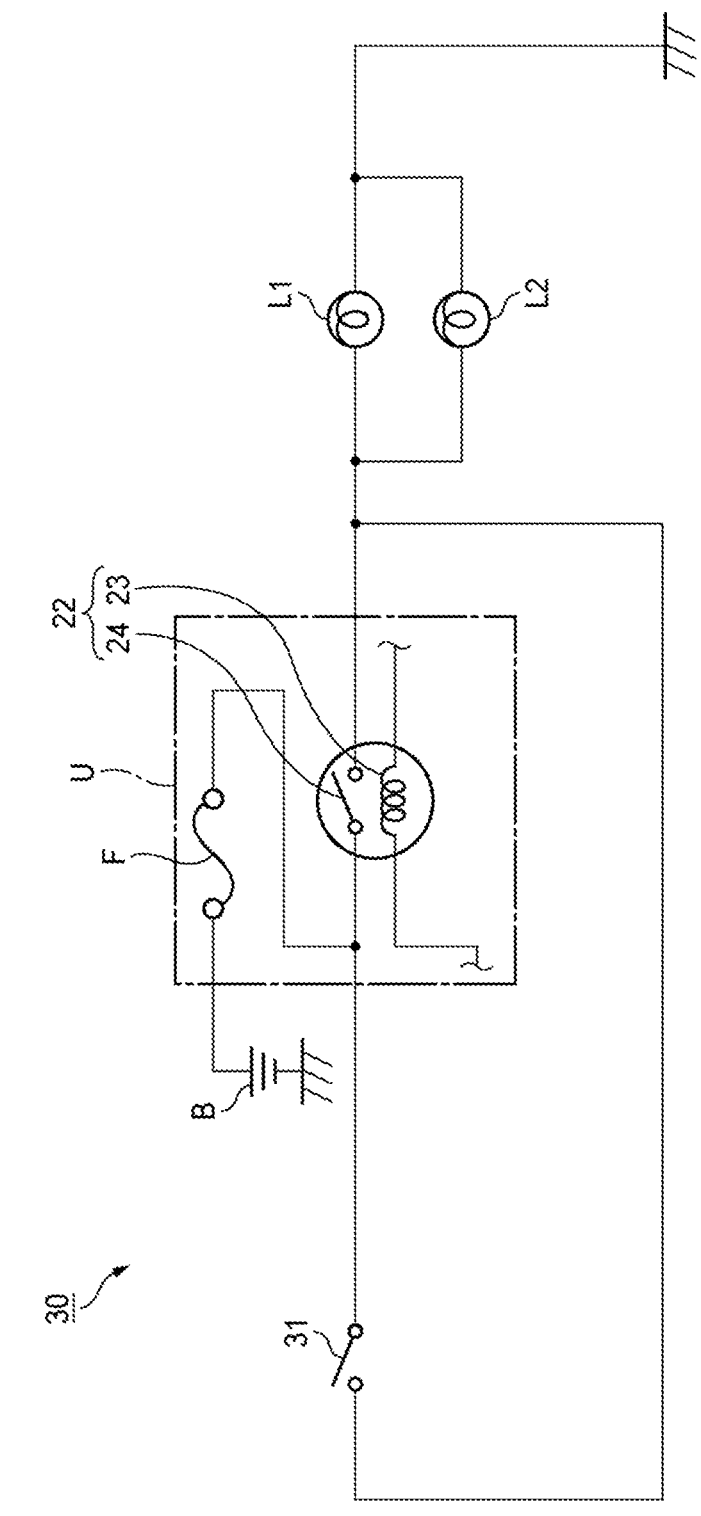
FIG. 4 is a schematic circuit configuration diagram illustrating a vehicle power supply circuit according to a second related example.

Next, an electric path at the time of energization of the vehicle power supply circuit 10 is described with reference to FIG. 2. FIG. 2 is a schematic circuit configuration diagram showing a state in which the vehicle power supply circuit 10 shown in FIG. 1 is energized.

An arrow in FIG. 2 indicates a path (flow) of electricity from the power supply B when the vehicle power supply circuit 10 is energized. In description using FIG. 2, when the vehicle power supply circuit 10 of the present embodiment is mounted on a vehicle, only the first switch circuit 11A is set to be capable of switching to an open or short circuit.

As shown in FIG. 2, when the transmission of the vehicle is switched to the back gear, the first switch circuit 11A is switched from an open circuit to a short circuit first. By the switching, the first switch circuit 11A is energized, and a current from the power supply B is shunted before the excitation coil 13 of the relay circuit 12 and the diode 16. One current flows to the excitation coil 13 of the relay circuit 12, and a magnetic field is generated in the excitation coil 13. According to the generation of the magnetic field, the switch unit 14 of the relay circuit 12 is attracted by magnetic force to be switched from an open circuit to a short circuit. The other current passes through the diode 16 and flows to the back lamps L1 and L2.

Also, the current passing through the excitation coil 13 of the relay circuit 12 flows directly to the ground.

Next, when the switch unit 14 of the relay circuit 12 is switched to a short circuit, the switch unit 14 of the relay circuit 12 is energized, and a current from the power supply B flows to the resistor 15. At this time, the current from the power supply B is shunted before the first switch circuit 11A and the switch unit 14 of the relay circuit 12, and one current continues flowing to the first switch circuit 11A, and the other current continues flowing to the switch unit 14 of the relay circuit 12. Here, the resistor 15 is connected to the negative electrode side of the switch unit 14 of the relay circuit 12, and the resistance value of the resistor 15 is set based on the rated value of the first switch circuit 11A, so that a current having a desired value flows to the first switch circuit 11A. Accordingly, a current as per a specification (rating) of the first switch circuit 11A flows, and as a result, an oxide film generated at a contact of the first switch circuit 11A can be removed.

The current flowing in the resistor 15 and a current flowing in the diode 16 merge and flow to the pair of back lamps L1 and L2 respectively. In this manner, electricity flows to the pair of back lamps L1 and L2, and the pair of the back lamps L1 and L2 are turned on.

Even in the second switch circuit 11B, the current flows from the power supply B similarly, but the second switch circuit 11B is not subject to limitation of the current specification, and is energized as it is.

<Concerning Advantages of Vehicle Power Supply Circuit of the Present Embodiment>

As described above, according to the vehicle power supply circuit 10 of the present embodiment, the rated value of the current flowing from the power supply B to the switch circuit 11A itself is set in the first switch circuit 11A among the plurality of switch circuits 11A and 11B, and even when specifications are different between the first switch circuit 11A and the second switch circuit 11B, a desired current can flow to the switch circuit 11A in which the rated value is set by using the resistor 15 which is a simple circuit element. Accordingly, even when the specifications of the switch circuits 11A and 11B are different, the circuit can be standardized with a simple configuration, and versatility can be improved. Therefore, the manufacturing cost of the vehicle power supply circuit 10 can be reduced, and work efficiency at the time of vehicle mounting can be improved. Further, since the current from the power supply B which has flowed to the switch circuits 11A and 11B returns through the diode 16 to the back lamps L1 and L2 which are load sides, loss of electric energy can be reduced.

According to the vehicle power supply circuit 10 of the present embodiment, a resistance value of the resistor 15 is set based on the rated value. Since the resistor 15 having various resistance values can be obtained easily at low cost, standardization of the circuit can be easily realized, and an increase in manufacturing cost can be prevented.

Further, according to the vehicle power supply circuit 10 of the present embodiment, only one of the plurality of switch circuits 11A and 11B corresponding to the specification of the vehicle is set to be capable of being switched to an open or short circuit, and the rest of the plurality of switch circuits 11A and 11B is set to be open at all times. Since one of the plurality of switch circuits 11A and 11B is selected according to the specification of the vehicle, it can be applied to various vehicle types, and versatility of the circuit can be improved.

According to the vehicle power supply circuit 10 of the present embodiment, a plurality of back lamps (loads) L1 and L2 are provided and connected in parallel to each other. Electric power can be supplied from the power supply B to the pair of back lamps (a plurality of loads) L1 and L2 through the switch circuits 11A and 11B simultaneously.

The circuit configurations of the vehicle power supply circuit 10 of the present embodiment is not limited to use for a vehicle, and can be widely applied to a power supply circuit used in various fields. Even in this case, the same operation effects as those of the vehicle power supply circuits 10 described above can be obtained.

Although the description of the specific embodiments is completed above, aspects of the present invention are not limited to these embodiments, and may be appropriately modified, improved, or the like.

Here, characteristics of the vehicle power supply circuit 10 according to the embodiments of the present invention described above will be briefly summarized and listed in the following [1] to [4], respectively.

[1] A vehicle power supply circuit (10, 20) including:
a plurality of switch circuits (11A, 11B) which are connected in parallel to each other and connected to a power supply (B) at one end (positive electrode side) to be switched to an open or short circuit separately;
a relay circuit (12) including an excitation coil (13) of which one end (positive electrode side) is connected to the other end (negative electrode side) of the plurality of switch circuits (11A, 11B) separately and the other end (negative electrode side) is grounded, and a switch unit (14) which is connected to the power supply (B) at one end (positive electrode side) and is switched from an open circuit to a short circuit since a current flows from the power supply (B) to the excitation coil (13) through the plurality of switch circuits (11A, 11B);
one or more loads (L1, L2) of which one end (negative electrode side) is grounded, and the other end (positive electrode side) is supplied with electric power from the power supply (B);
a resistor (15) disposed between the other end (negative electrode side) of the switch portion (14) and the other end (positive electrode side) of the one or more loads (back lamps L1 and L2), of which one end (positive electrode side) is connected to the other end (negative electrode side) of the switch portion (14), and the other end (negative electrode side) is connected to the other end (positive electrode side) of the load (back lamps L1 and L2); and
a rectifier (16) which causes the current of the power supply (B) to flow in one direction from the plurality of switch circuits (11A, 11B) to the one or more loads (back lamps L1 and L2), of which one end (positive electrode side) is connected to the other end (negative electrode side) of the plurality of switch circuits (11A, 11B), and the other end (negative electrode side) is connected to the other end (negative electrode side) of the resistor (15) and the other end (positive electrode side) of the one or more loads (back lamps L1 and L2).

[2] The vehicle power supply circuit (10) according to [1], in which
a rated value of a current flowing from the power supply (B) to the switch circuit is set in at least one of the plurality of switch circuits (11A, 11B), and
a resistance value of the resistor (15) is set based on the rated value.

[3] The vehicle power supply circuit (10) according to [1], in which
when mounted on a vehicle, only one of the plurality of switch circuits (11A, 11B) corresponding to a specification of the vehicle is set to be capable of being switched to an open or short circuit, and the rest of the plurality of switch circuits (11A, 11B) is set to be open at all times.

[4] The vehicle power supply circuit (10) according to [1], in which
a plurality of the loads (back lamps L1 and L2) are provided and connected in parallel with each other.

What is claimed is:

1. A vehicle power supply circuit comprising:
a plurality of switch circuits which are connected in parallel to each other and connected to a power supply at one end to be switched to an open or short circuit separately;
a relay circuit including an excitation coil of which one end is connected to the other end of the plurality of switch circuits separately and the other end is grounded, and a switch unit which is connected to the power supply at one end and is switched from an open circuit to a short circuit since a current flows from the power supply to the excitation coil through the plurality of switch circuits;
one or more loads of which one end is grounded, and the other end is supplied with electric power from the power supply;
a resistor disposed between the other end of the switch unit and one end of the one or more loads, of which one end is connected to the other end of the switch unit, and the other end is connected to the other end of the one or more loads; and
a rectifier which causes the current of the power supply to flow in one direction from the plurality of switch circuits to the one or more loads, of which one end is connected to the other end of the plurality of switch circuits, and the other end is connected to the other end of the resistor and the other end of the one or more loads.

2. The vehicle power supply circuit according to claim 1, wherein
a rated value of a current flowing from the power supply to a switch circuit is set in at least one of the plurality of switch circuits, and
a resistance value of the resistor is set based on the rated value.

3. The vehicle power supply circuit according to claim 1, wherein
when mounted on a vehicle, only one of the plurality of switch circuits corresponding to a specification of the vehicle is set to be capable of being switched to an open or short circuit, and the rest of the plurality of switch circuits is set to be open at all times.

4. The vehicle power supply circuit according to claim 1, wherein
a plurality of the loads are provided and connected in parallel with each other.

* * * * *